United States Patent
Wu et al.

(10) Patent No.: US 7,177,783 B2
(45) Date of Patent: Feb. 13, 2007

(54) SHAPE BASED NOISE CHARACTERIZATION AND ANALYSIS OF LSI

(75) Inventors: Lifeng Wu, Fremont, CA (US); Jianlin Wei, San Jose, CA (US); I-Hsien Chen, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 725 days.

(21) Appl. No.: 10/340,222

(22) Filed: Jan. 10, 2003

(65) Prior Publication Data

US 2003/0229481 A1 Dec. 11, 2003

Related U.S. Application Data

(60) Provisional application No. 60/387,272, filed on Jun. 7, 2002, provisional application No. 60/387,294, filed on Jun. 7, 2002.

(51) Int. Cl.
*G06F 17/10* (2006.01)

(52) U.S. Cl. .............................. 703/2; 702/65; 702/70; 702/67; 703/14; 703/16; 703/18; 716/5

(58) Field of Classification Search .................... 703/2, 703/14, 16, 18; 702/65, 70, 117, 67; 323/286; 188/181 A; 326/87; 716/5; 347/10, 11; 349/37

See application file for complete search history.

(56) References Cited

U.S. PATENT DOCUMENTS 5,111,133 A * 5/1992 Poulo et al. ................. 323/286

| | | |
|---|---|---|
| 5,198,986 A | 3/1993 | Ikeda et al. |
| 5,243,547 A | 9/1993 | Tsai et al. |
| 5,417,312 A * | 5/1995 | Tsuchitani et al. ...... 188/181 A |
| 5,446,674 A | 8/1995 | Ikeda et al. |
| 5,481,695 A | 1/1996 | Purks |
| 5,535,133 A | 7/1996 | Petschauer et al. |
| 5,568,395 A | 10/1996 | Huang |
| 5,596,506 A | 1/1997 | Petschauer et al. |

(Continued)

OTHER PUBLICATIONS

Shimazaki et al., "Lemings: LSI's EMI-noise analysis with gate level simulator", IEEE 2000.*

(Continued)

*Primary Examiner*—Kandasamy Thangavelu
(74) *Attorney, Agent, or Firm*—Parsons Hsue & de Runtz LLP (57) ABSTRACT

The invention allows the inclusion of cross-talk coupling and other noise in circuit simulation by considering a resultant glitch in more detail than just its peak value. A set of parameters represents the noise, with an exemplary embodiment using a triangle approximation to a glitch based on a set of three parameters: the peak voltage value, the leading edge slope and the trailing edge slope. These values are then used as the input stimulus to a given cell instance in the network in which the resulting propagated noise values, also in a triangle approximation, are determined by a simulation. The results can be stored as a library so that, given the parameters of the input noise and the particular cell, a simulation can determine the propagated noise through a look-up process. To reduce the space requirements of the library, the dimensionality of the look-up tables can be reduced through the introduction of a set of auxiliary functions to offset error from this reduction.

22 Claims, 5 Drawing Sheets

U.S. PATENT DOCUMENTS

| | | | |
|---|---|---|---|
| 6,028,989 A | | 2/2000 | Dansky et al. |
| 6,051,995 A * | | 4/2000 | Pollachek .................... 326/87 |
| 6,215,533 B1 * | | 4/2001 | Shigeta et al. ............... 349/37 |
| 6,279,142 B1 | | 8/2001 | Bowen et al. |
| 6,301,547 B2 * | | 10/2001 | Felps .......................... 702/67 |
| 6,493,853 B1 | | 12/2002 | Savithri et al. |
| 6,629,741 B1 * | | 10/2003 | Okuda et al. ................. 347/11 |
| 6,826,736 B2 * | | 11/2004 | Wu et al. ....................... 716/5 |
| 6,947,456 B2 * | | 9/2005 | Chin et al. ............... 372/38.02 |
| 7,013,253 B1 * | | 3/2006 | Cong et al. ................... 703/14 |
| 2001/0044709 A1 * | | 11/2001 | Fujimori et al. ............... 703/2 |
| 2002/0022951 A1 * | | 2/2002 | Heijningen et al. .......... 703/16 |
| 2002/0033510 A1 * | | 3/2002 | Tomita ....................... 257/372 |
| 2002/0036666 A1 * | | 3/2002 | Taki ............................. 347/10 |
| 2002/0147553 A1 * | | 10/2002 | Shimazaki et al. .......... 702/65 |
| 2002/0147555 A1 * | | 10/2002 | Nagata et al. ................ 702/70 |
| 2002/0193959 A1 * | | 12/2002 | Wanek et al. ............... 702/117 |
| 2003/0083856 A1 * | | 5/2003 | Yoshimura et al. .......... 703/18 |
| 2003/0154453 A1 * | | 8/2003 | Gauthier et al. ............... 716/5 |

OTHER PUBLICATIONS

Lee, "The Generalized Delay Time and Cross Talk Models for the Interconnect Optimization Design," ISIC-2001: Proceedings of 9th International Symposium on Integrated Circuits, Device and Systems, 2001, pp. 291-294.

International Search Report mailed Jul. 24, 2003.

Liu et al., "The Combined Effects of Internal Noise and Electromagnetic Interference in CMOS VLSI Circuits," *Sixth International Conference on Electromagnetic Compatibility*, 1988, pp. 303-322.

Shepard et al., "Cell Characterization for Noise Stability," *IEEE 2000 Custom Integrated Circuits Conference*, pp. 91-94.

Sato et al., "Accurate *In Situ* Measurement of Peak Noise and Delay Change Induced by Interconnect Coupling," *IEEE Journal of Solid-State Circuits*, vol. 36, No. 10, Oct. 2001, pp. 1587-1591.

Ilumoka, "Efficient ANN-Based Interconnect Delay and Crosstalk Modeling," *Proc. 22nd International Conference on Microelectronics (Miel 2000)*, vol. 2, Nis, Servia, May 14-17, 2000, pp. 727-730.

Lee et al., "Generalized Interconnect Delay Time and Crosstalk Models: I. Application of Interconnect Optimization Design," *Jpn. J. Appl. Phys.*, vol. 40(2001) pp. 6686-6693.

Lee et al., "Generalized Interconnect Delay Time and Crosstalk Models: II. Crosstalk-Induced Delay Time Deterioration and Worst Crosstalk Models," *Jpn. J. Appl. Phys.*, vol. 40 (2001), pp. 6694-6699.

Kahng et al., "Noise and Delay Uncertainty Studies for Coupled RC Interconnects," *Twelfth Annual IEEE International ASIC/SOC Conference*, 1999, p. 3-8.

Chen et al., "Test Generation for Crosstalk-Induced Faults: Framework and Computational Results," *Journal of Electronic Testing: Theory and Applications*, 18, 2002, pp. 17-28.

* cited by examiner

SHAPE BASED NOISE CHARACTERIZATION AND ANALYSIS OF LSI

The present application claims priority from U.S. provisional patent application Ser. No. 60/387,272, filed Jun. 7, 2002, and is related to a concurrently filed U.S. patent application entitled "Shape Based Noise Tolerance Characterization and Analysis of LSI" which claims priority from U.S. provisional patent application Ser. No. 60/387,294, filed Jun. 7, 2002, all of which are hereby incorporated by reference.

BACKGROUND OF THE INVENTION

This invention pertains to the field of simulating the operation of integrated circuits, and has application to the inclusion of noise effects into such simulations.

In the modeling and simulation of integrated circuits, many effects need to be considered. Some of these effects can be neglected in some circumstances, but begin to introduce non-negligible effects in other circumstances. Similarly, models and techniques that are effective in one regime begin to become unreliable when pushed into other regimes. One set of effects that can influence the operation of a circuit is noise, both from within the various cells that make up the circuit and arising in the connections between these cells.

One particular source of noise in large scale integrated (LSI) circuits is coupling noise between independent networks. This is illustrated schematically in FIG. 1, where a signal in one network, the "victim" network B, 105 is affected by an adjacent network A, the "aggressor" network, 103 through a coupling capacitance $C_C$ 101. For this discussion, network A 103 is shown to only have one instance of a cell and receives a rising waveform 110 going from a low "0" logic level taken as ground to a high "1" logic $V_{DD}$. In the network B, the coupling capacitance is shown attached to network B between two cell instances, the first receiving a falling waveform 111 as input.

Figure 1:
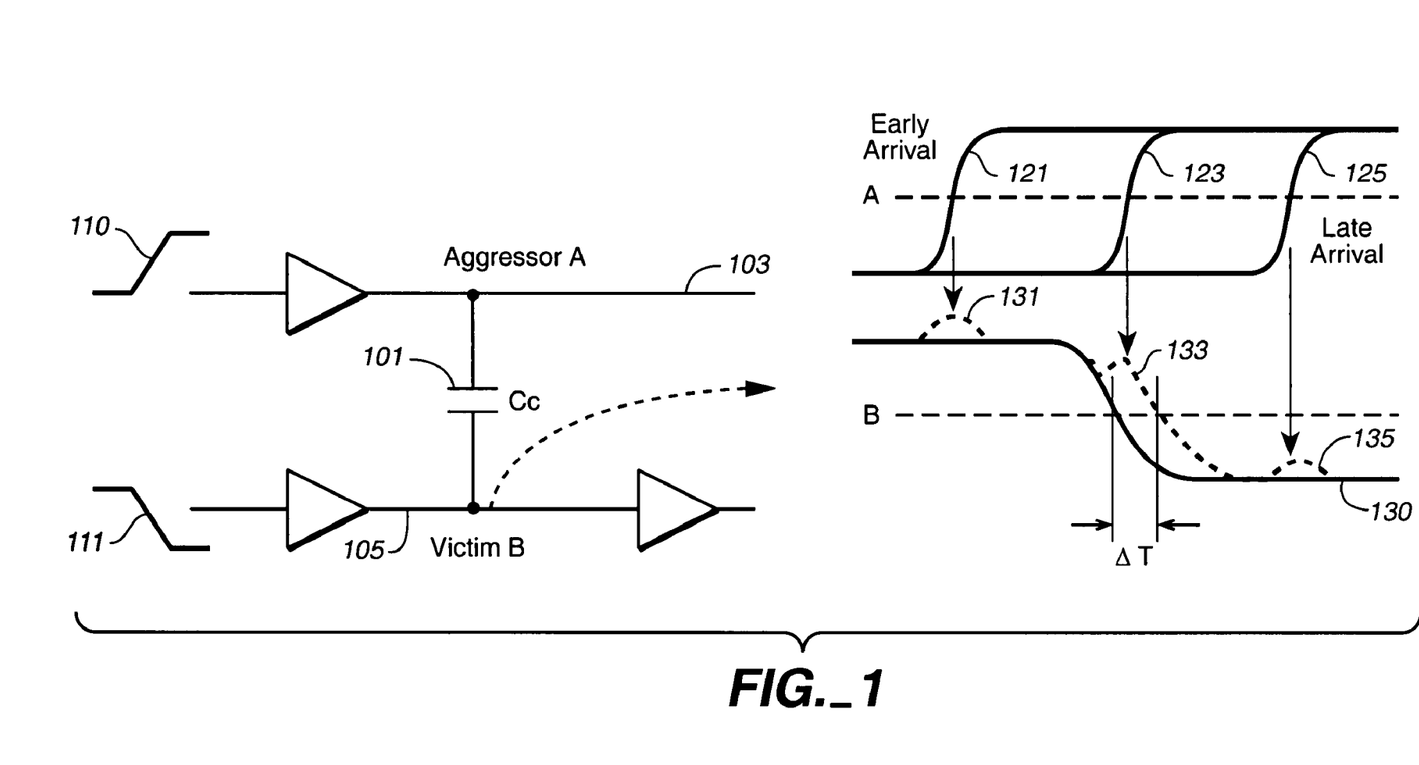
FIG. 1 illustrates an example of the effect of noise due to cross-talk coupling.

The impact on the victim network B 105 due to this cross-talk can include glitches and delay changes as shown in the right potion of FIG. 1. The output signal in network A that is capacitively coupled through $C_C$ 101 to network B is shown for three different timings of A's input 110 relative to B's input signal: early arrival 121, more or less coincidental arrival 123, and late arrival 125, with the output signal in network B shown as 130. The signal 130, shown as a solid line, represents the output signal in the absence of any cross-talk, with the effects of the noise represented by the broken lines 131, 133, and 135. The early arrival signal 121 and the late arrival signal 125 results in respective glitches 131 and 135. The more or less coincidental signal 123 shifts the falling waveform to 133 and is perceived as a delay of ΔT. The delay 133 can affect circuit performance. The glitches can potentially cause greater problems: for example, if B is a digital portion of the circuit and glitch 135 is too large, this can be perceived by subsequent cells in network B as an incorrect logic state.

As a glitch propagates through a network it can damage the circuit in many ways. It may be magnified or reduced in the cells it passes through. It may also accumulate with other induced glitches. Eventually, the glitch height and width may be enough to toggle the inputs of storage cell and cause the output value to change. An example is shown in FIG. 2.

Figure 2:
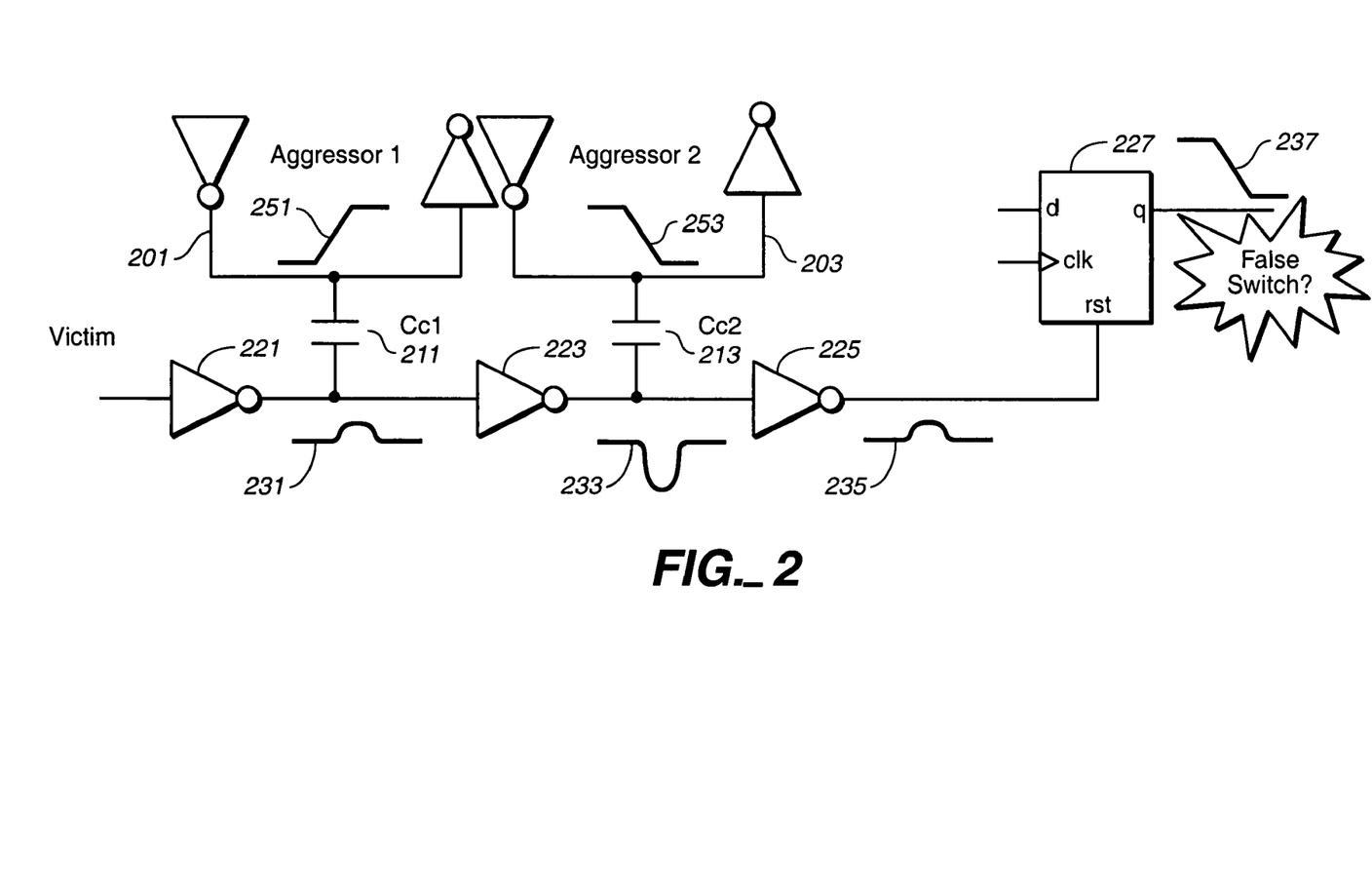
FIG. 2 is an example of how a glitch can affect a circuit.

In FIG. 2, the victim network is taken to consist of inverters 221, 223, and 225 in series connected to the reset of a flip-flop 227. Between inverters 221 and 223, the victim is capacitively coupled through a capacitance $C_{C1}$ 211 to a first aggressor network 201. It is also capacitively coupled through a capacitance $C_{C2}$ 213 to a second aggressor network 203 between inverters 223 and 225. A rising waveform in network 201 introduces glitch 231. The induced noise 231 propagates through inverter 223 where it is compounded with the result of a falling waveform in network 203 to produce the glitch 233, a result of both the newly induced noise combined with the propagated noise. The propagated noise from inverter 225 is shown as 235, which is connected to the reset input (rst) of flip-flop 227. If this noise is sufficient enough, it can cause the flip-flop 227 to output a false switch 237.

Figure 3:
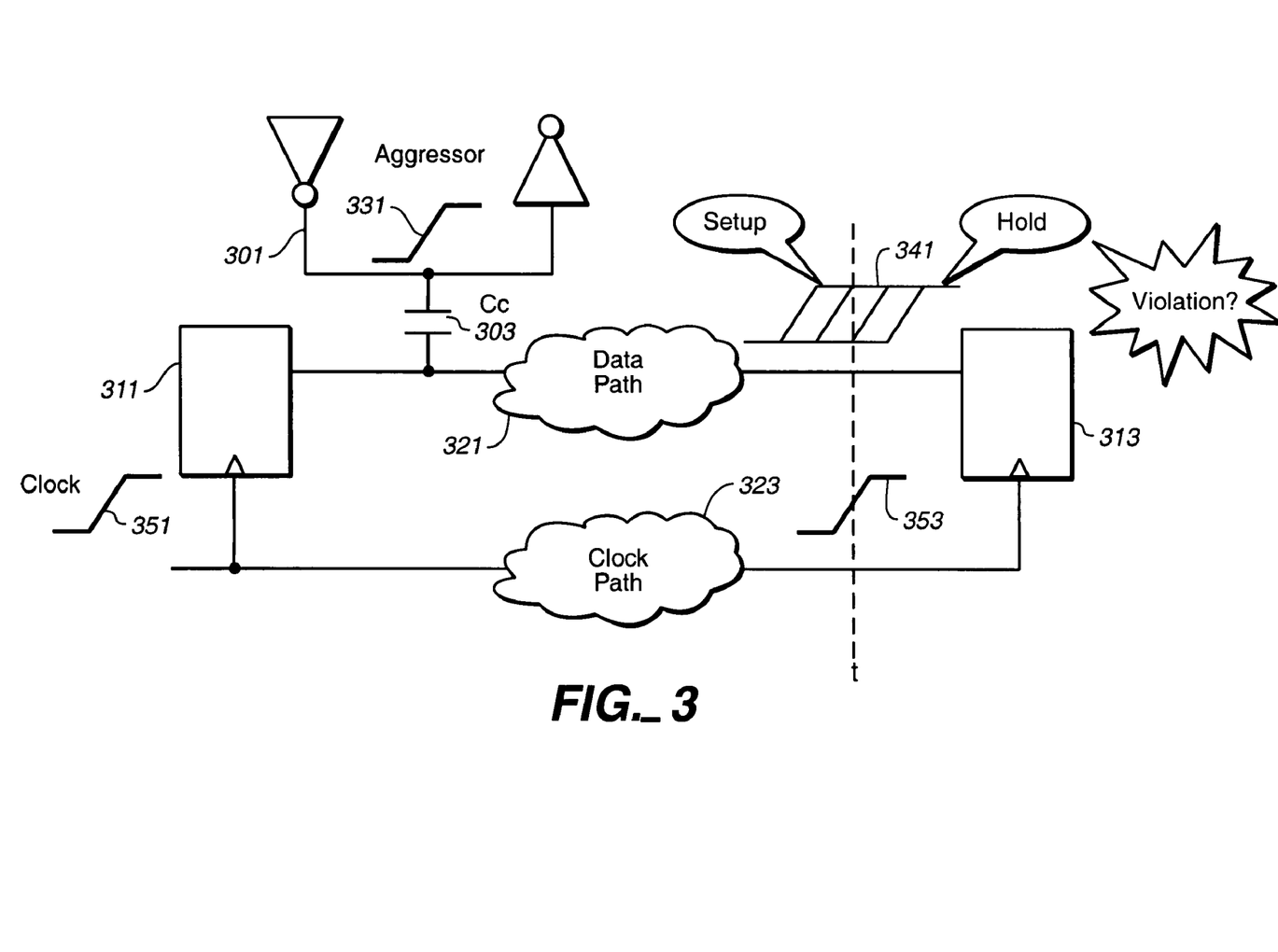
FIG. 3 is an example of how delay can affect a circuit.

An example of the effects of delay is illustrated in FIG. 3. The figure shows two instances of a flip-flop, 311 and 313, connected along a clock path 323 and a data path 321. A clock signal 351 is supplied to the reset input of flip-flop 311 and, through clock path 323, to the reset of input 313, where the propagated clock signal is shown as 353. The data path 321 is capacitively coupled through capacitance $C_C$ 303 to an aggressor network 301 so that a signal, such as waveform 331, in network 301 can induce noise in the data path. This can result in a delay or speed up for a waveform propagating through the data path 321, such as shown in 133 of FIG. 1. This can result in the propagated waveform 341 in the data path having a temporal offset relative to the propagated clock signal 353. The propagated data waveform 341 illustrates this by showing several rising waveforms either retarded or advanced with respect to the time t when the clock signal passes through $½V_{dd}$. Similarly, a delay or speed-up can occur in the clock path. These offsets can change the relative timing of clock or data signals when they arrive at cell 313 and possibly cause a violation. For example, a setup time violation can result from a worst data path delay (slow-down) combined with a best clock path delay (speed-up); conversely, a hold time violation can result from a best data path delay (speed-up) combined with a worst clock path delay (slowdown).

In the consideration of how such noise can affect circuit operation, and how it can be included in circuit simulations, a number of factors enter in and should be considered. These include how the noise is generated, how the noise propagates, and how it affects later circuit elements should all be considered. Various aspects of noise all dealt with in "Cell characterization for noise stability", K. L. Shepard and K. Chou, *IEEE 2000 Custom Integrated Circuits Conference,* and, more generally, in "Digital Integrated Circuits: a Design Perspective", Jan M. Rabaey, Prentice Hall, both of which are hereby incorporated by reference. More particularly, one prior art method of treating some aspects of noise, noise margins, is discussed in section 3.2 of the second of these references.

The use of DC/AC noise margin methods present an approach to consider peak noise on a cell level by looking at the allowable noise level that can occur between the signal leaving the output of one stage and arriving at the input of the subsequent cell. Briefly, the voltage in a circuit will typically fall in a range ground to $V_{dd}$. A well-defined digital state "0" will lie between 0V (or, more generally, $V_{ss}$) and a value $V_L$ and a well-defined digital state "1" will lie between a value $V_H$ and $V_{dd}$, with the range of $V_L$ to $V_H$ being an unstable x region. If the additional subscript O corresponds to the output of one stage and the subscript I corresponds to the input of the subsequent cell, noise margins $M_H$ and $M_L$, $$M_L = V_{IL} - V_{OL}$$

$$M_H = V_{OH} - V_{IH},$$

represent the maximum amount of noise that can safely accumulate between cells.

Although this provides one simple way to consider the effects of noise, it only looks at peak noise value. In many cases, this is too simple an approach to noise and circuit designers could use improvement techniques.

SUMMARY OF THE INVENTION

The present invention presents techniques for considering the effects of cross-talk coupling and other noise by considering a resultant glitch in more detail than just its peak value. One aspect of the present invention uses a set of parameters to represent this noise. An exemplary embodiment uses a triangle approximation to a glitch based on a set of three parameters: the peak voltage value, the leading edge slope and the trailing edge slope. These values are then used as the input stimulus to a given cell instance in the network in which the resulting propagated noise values, also in a triangle approximation, are determined by a simulation. In another aspect of the present invention, the results are stored as a library. In this manner, given the parameters of the input noise and the particular cell, a simulation can determine the propagated noise through a look-up process. In a variation, a set of formulae can provide the propagated noise from the input noise. To reduce the space requirements of the library, a further aspect of the present invention reduces the dimensionality of the look-up tables through the introduction of a set of auxiliary functions to offset error from this reduction. Additionally, the values of the propagated noise can be used to check the noise tolerance of the circuit.

Additional aspects, features and advantages of the present invention are included in the following description of exemplary embodiments, which description should be read in conjunction with the accompanying drawings.

DESCRIPTION OF EXEMPLARY EMBODIMENTS OF THE INVENTION

The prior art has a number of problems that lead to inaccuracies in the treatment of noise propagation and its effect on subsequent cells. To more accurately simulate noise in a circuit, the glitch is considered more accurately and not just in terms of peak values. One aspect of the present invention considers the noise waveform in more detail, including not only its amplitude or peak value (Vp), but also its shape, including details such as its width (W) and slope (slew rates for rising and falling edges). Two different glitches with the same peak value Vp can affect a subsequent cell quite differently. For example, in FIG. 2 a very narrow glitch at the rst input may not result in a false switch whereas a wider glitch of the same peak value may. For some cells, differing rise or fall times will affect the cell differently. Traditionally, the analysis of digital circuits would not worry about width and other glitch characteristics as these are more of an analog concern.

Figure 4:
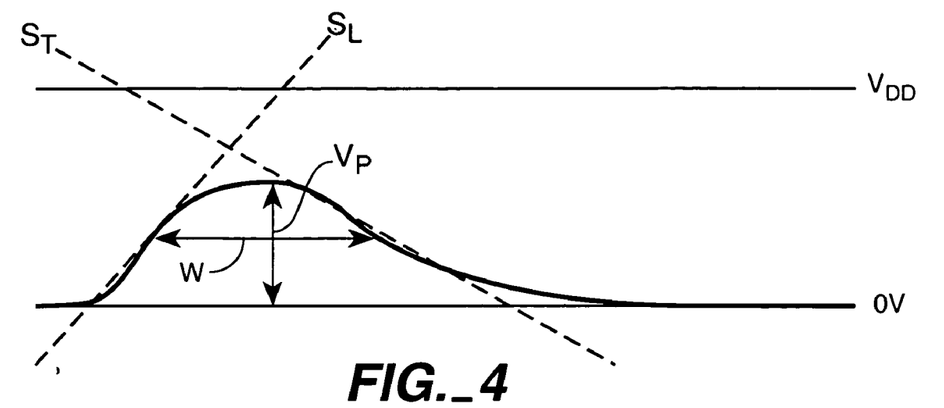
FIG. 4 shows a generic glitch and some associated parameters.

A generic glitch is shown in FIG. 4, where the baseline (noiseless) signal upon which the noise is added is taken as $V_{ss}$ or 0V to simplify the discussion. The glitch has a maximum amplitude Vp, a width W, a leading edge slope $S_L$, and a trailing edge slope $S_T$. The width and slopes can be defined in many ways, depending where on the glitch they are taken. Thus, there are many ways to parameterize a glitch using different numbers of parameters, the simplest beyond just the peak value being the inclusion of a width. For example, the glitch could be modeled on a gaussian distribution having a height Vp and width W, with any deviations from a gaussian based on the higher moments of the distribution. Alternately, W could be defined as the width at $\frac{1}{2}V_{dd}$, $\frac{1}{2}Vp$ or other fraction of distance between the high and low voltage values.

Figure 5:
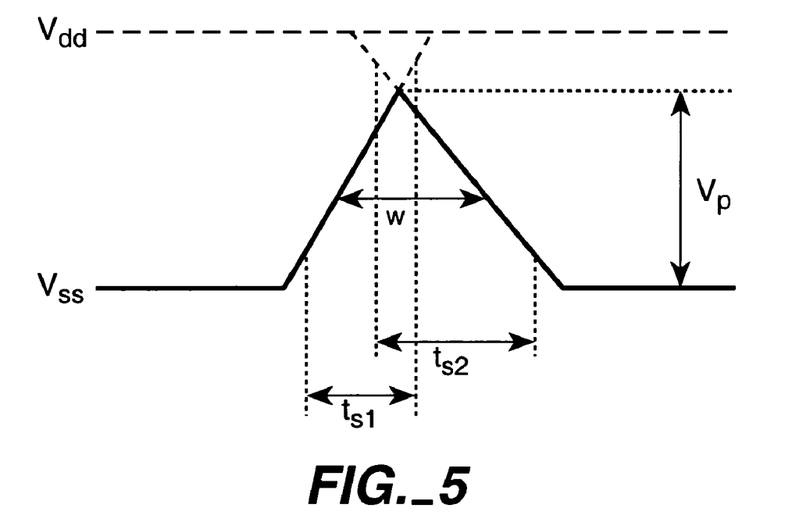
FIG. 5 shows an exemplary parameterization for use in a triangle approximation embodiment.

In an exemplary embodiment, the noise waveform method uses a triangle waveform approximation as shown in FIG. 5 for the incident noise waveform. The system voltage is taken to range between a low value of $V_{ss}$ and a high value of $V_{dd}$ and noise waveform parameters describing the triangle approximation are taken as Vp, $t_{s1}$, and $t_{s2}$. The width of the triangle is given by W. The set of parameters (Vp, $t_{s1}$, $t_{s2}$) represent the glitch as it arrives at a given instance of a cell. The propagated noise waveform parameters describing the triangle approximation are similarly defined and given by the parameter set (Vp', $t_{s1}$', and $t_{s2}$'). Alternate parameterizations of the triangle, for example based on angles, can be used, as can other definitions of Vp, $t_{s1}$, and $t_{s2}$. Other approximation schemes can be based on other piece-wise linear forms, such as a trapezoid, or other shapes. In the exemplary parameterization of FIG. 5, the amplitude Vp is defined as the height of the glitch above a baseline of $V_{ss}$ and W is defined as the width from $0.5V_{dd}$ on the leading edge to $0.5V_{dd}$ on the trailing edge. For $t_{s1}$ and $t_{s2}$, the definition is taken to be consistent with that in timing library. Generally, these are defined as 0.1Vdd to 0.9Vdd for a rising edge and 0.9Vdd to 0.1 Vdd for a falling edge.

Various methods for simulating integrated circuit operation and how the cells within them respond to a particular input, such as that of the triangle approximation given by parameters set (Vp, $t_{s1}$, $t_{s2}$), are described in the following U.S. patent applications, all of which are hereby incorporated by reference: Ser. No. 09/661,328, filed Sep. 14, 2000, and entitled "MOSFET Modeling for IC Design Accurate for High Frequencies"; Ser. No. 09/832,933, filed Apr. 11, 2001, and entitled "Hot-Carrier Circuit Reliability Simulation"; Ser. No. 09/969,186, filed Sep. 27, 2001, and entitled "Hot-Carrier Reliability Design Rule Checker"; and Ser. No. 09/969,185, filed Sep. 27, 2001, and entitled "Hot-Carrier Device Degradation Modeling And Extraction Methodologies".

The present invention looks at how the noise propagates from one cell to another and how the noise will affect the instant cell. The noise arriving at a cell is characterized, for example by a set of parameters such as the exemplary (Vp, $t_{s1}$, $t_{s2}$), or alternately a peak voltage and a suitable defined width or other characterization. Using this characterization, the response of different elements to this stimulus is determined by a SPICE simulation or other techniques. This allows the resultant propagated noise to be characterized in terms of the characterization of the input noise. In the exemplary embodiment, the results in the propagated noise waveform parameters $V_p'$, $t_{s1}'$, and $t_{s2}'$ being expressed in terms of the noise waveform parameters $V_p$, $t_{s1}$, and $t_{s2}$.

Thus, the relations between input noise and propagated noise in the exemplary embodiment of the noise waveform method is given by:

$$V_p' = V_p'(V_p, t_{s1}, t_{s2}, C_{load})$$

$$t_{s1}' = t_{s1}'(V_p, t_{s1}, t_{s2}, C_{load})$$

$$t_{s2}' = t_{s2}'(V_p, t_{s1}, t_{s2}, C_{load}),$$

where $C_{load}$ is the load capacitance of an output pin of the particular instance. The notation indicates that each of the output parameter set $(V_p', t_{s1}', t_{s2}')$ is a function of input set $(V_p, t_{s1}, t_{s2}, C_{load})$.

In a further aspect of the present invention, these responses are saved in a library for each of the simulated elements. Thus, for a given cell instance with a given set of input values $(V_p, t_{s1}, t_{s2}, C_{load})$, the library supplies the resultant $V_p'$, $t_{s1}'$, and $t_{s2}'$ values. For practicality, there are several library considerations. Generally, the maximum number of desirable dimensions of tables in noise library is no more than three dimensions, whereas the described relations between input noise and propagation noise are four dimensional, corresponding to the four input parameters.

Yet another aspect of the present invention employs a dimensional reduction technique to the library. In the exemplary embodiment, the pair of input variables $t_{s1}$ and $t_{s2}$ are replaced by the combination $(t_{s1}+t_{s2})$, representing an average of the leading and trailing slope values. This reduces the four dimensional case to a more tractable three dimensions. To account for any error this introduces, a set of correction factors can be introduced. More specifically, the new approximate relations between input noise and propagation noise are expressed as:

$$V_p' = V_p'(V_p, t_{s1}+t_{s2}, C_{load}), K_{vp}' = K_{vp}'(V_p, t_{s1}+t_{s2}, C_{load})$$

$$t_{s1}' = t_{s1}'(V_p, t_{s1}+t_{s2}, C_{load}), K_{ts1}' = K_{ts1}'(V_p, t_{s1}+t_{s2}, C_{load})$$

$$t_{s2}' = t_{s2}'(V_p, t_{s1}+t_{s2}, C_{load}), K_{ts2}' = K_{ts2}'(V_p, t_{s1}+t_{s2}, C_{load}),$$

where the K factors are the correction terms. When $t_{s1}+t_{s2}$=Const., the K factor reflects the effect of different combination between $t_{s1}$ and $t_{s2}$. Thus, the four dimensional library for three functions is exchanged for a three dimensional library for six functions. For more than a few input value sets this can result in significant savings of space. For example, a given cell may have a library compiled from m=5–10 values for each of the input parameters, leading to a reduction by a factor of, say, ½·10=5 for m=10.

Figure 6:
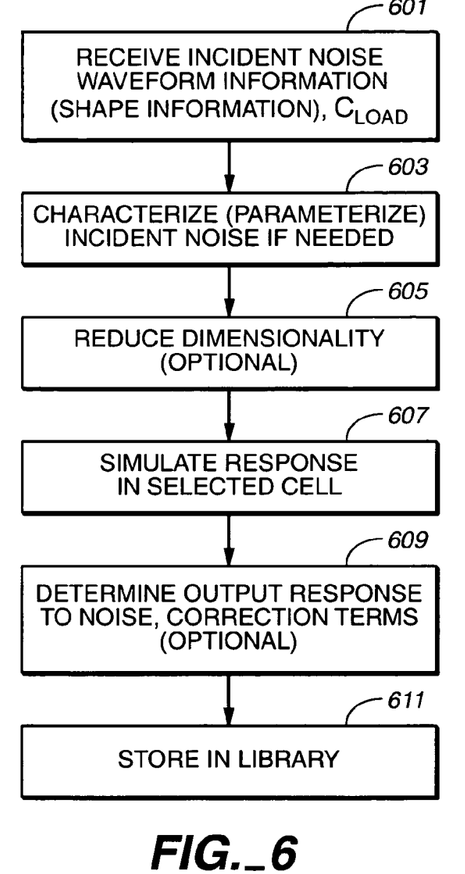
FIG. 6 is a flow chart of an exemplary embodiment for the characterization of noise response.

FIG. 6 is a flow chart of the representative embodiment of the present invention. In step 601, the information on the incident waveform is received or provided along with the $C_{load}$ value. Step 603 then characterizes the incident waveform as a set of parameters, if it was not already in this form initially in step 601. Step 603 is the optional dimensional reduction if the user decides on uses of less than all of the independent input variable, such as combining the leading and trailing slopes into an averaged value, $(t_{s1},t_{s2}) \rightarrow (t_{s1}+t_{s2})$, or other such reduction of the set of input parameters.

The response of the selected cells to the input noise data is then simulated in step 607. The response can be determined by a SPICE simulation or other techniques. The result in step 609 is then the set of output parameter, including the correction terms if a reduced set of input parameters has been used. Once these output values are determined, they can then be stored in a library in step 611.

Therefore, the exemplary embodiment of the noise waveform method can be described by its noise propagation parameter characterization, its K factor characterization, and its library usage for noise propagation. The propagation parameter characterization consists of the noise waveform using isosceles triangle waveform, namely $t_{s1}=t_{s2}$, using a SPICE or other simulator to simulate the output waveform, and measuring the output waveform parameters, $V_p'$, $t_{s1}'$ and $t_{s2}'$. For the K factor characterization, $V_p$, $(t_{s1}+t_{s2})$, and $C_{load}$ are taken as constants, but $t_{s1}$ and $t_{s2}$ use different values. Then, the process takes the point of $t_{s1}=t_{s2}$, corresponding to symmetric leading/trailing slopes, as the origin of coordinates and linearly fits the result, where the slope is K factor.

The library usage for noise propagation in the exemplary embodiment is then taken to include receiving the input parameters $V_p$, $t_{s1}$, $t_{s2}$, and $C_{load}$. From this, a table lookup gives the values $V_{p0}'$, where the 0 subscript corresponding to the symmetric $t_{s1}=t_{s2}$ case, and $K_{vp}'$ for the particular cell. Using these values, the following formula is used to calculate the final result of $V_p'$:

$$V_p' = V_{p0}' + (t_{s1} - (t_{s1}+t_{s2})/2)^* K_{vp}' = V_{p0}' + \tfrac{1}{2}(t_{s1}-t_{s2})K_{vp}'.$$

$V_p'$ is thus represented by a linear approximation around the symmetric value of $V_{p0}'$ with the correction factor $K_{vp}'$ multiplied by the measure of asymmetry $(t_{s1}-t_{s2})$. The values of $t_{s1}'$ and $t_{s2}'$ are calculated in the same way as $V_p'$:

$$t_{s1}' = t_{s1,0}' + (t_{s1} - (t_{s1}+t_{s2})/2)^* K_{vp}' = t_{s1,0}' + \tfrac{1}{2}(t_{s1}-t_{s2})K_{vp}',$$

$$t_{s2}' = t_{s2,0}' + (t_{s1} - (t_{s1}+t_{s2})/2)^* K_{vp}' = t_{s2,0}' + \tfrac{1}{2}(t_{s1}-t_{s2})K_{vp}'.$$

The general relation is $V_p' = V_{p0}' + \Delta V_p'$, with similar expressions for the other output parameters. If $\Delta V_p'$ is particularly non-linear in $(t_{s1}-t_{s2})$, a more complex form for $\Delta V_p$ or K can be used. For example, the K factor can be a piece-wise linear function to improve accuracy if the dependence on the variations from $t_{s1}=t_{s2}$ are non-linear or higher powers of $(t_{s1}-t_{s2})$ can be included in the expansion about $V_{p0}'$. More complex functions can also be used for K (or $\Delta V_p$) if desired, with the trade-off of more computation. Also, although the exemplary embodiment for library usage is based on a lookup table, alternate embodiments can use formulae instead of, or combined with, the lookup table.

Figure 7:
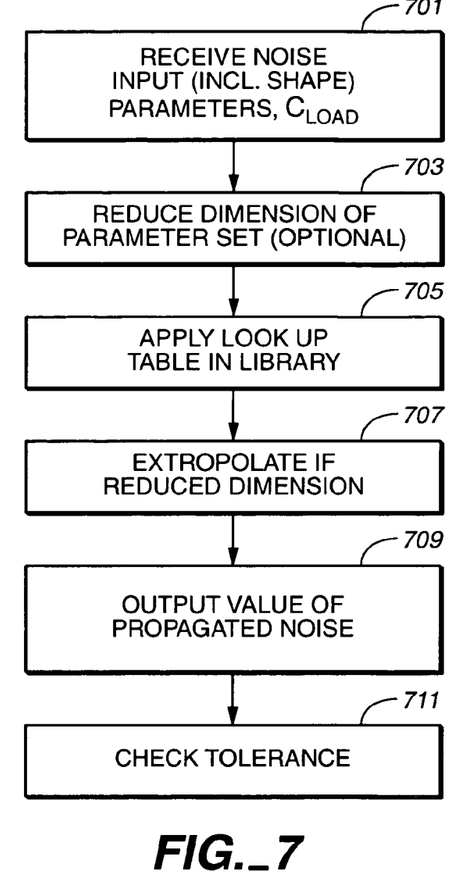
FIG. 7 is a flow chart for simulating the operation of a circuit using a library to determine propagated noise.

FIG. 7 is a flow chart illustrating this use of a library for circuit simulation. In step 701 the incident parameter set is provided. If the data on the information on the incident noise is not already parameterized, this will also be done at this stage. The incident parameter set will include parameters such as shape information (slopes, width, etc.), amplitude, and capacitive load. If the provided input parameter set does not correspond to the same elements as the input parameter set of the library, this can be converted in step 703. For example, the exemplary embodiment uses a dimensional reduction of $(t_{s1},t_{s2})$ to $(t_{s1}+t_{s2})$ so that this change would need to performed for the incident noise's information. As another example, if the incident information was provided as $(V_p,t_{s1},t_{s2})$ but the library for this particular cell element was in terms of $(V_p,W)$, the width would need to be extracted from the slopes and amplitude.

Step 705 is where the incident noise parameters are put into the appropriate look-up table. If a functional relation were used instead of a look-up table, a set of formulae would instead provide the propagated noise from the input noise. In step 703, any needed extrapolation, such as using the correction functions (K factors) described above, is performed, resulting in the output values for the propagated noise at step 709. This process can then be carried out for the next cell, with the output parameter values of step 709 now serving as input, or the noise tolerance can be checked at step 711.

The resultant values of the propagated noise waveform can be used to check for noise tolerance by considering whether the noise is sufficient to cause subsequent cells to fail. This can allow a designer to determine whether circuit changes are needed if noise levels are too high; or, conversely, if noise levels are low, the designer can change other circuit tolerances at the price of more noise if there is sufficient overhead. More specifically, the library usage for noise tolerance checking could use the input parameters Vp, $t_{s1}$, $t_{s2}$, and $C_{load}$ to determine the resulting output noise. The same steps as described above in the noise propagation analysis are used to get Vp'. If Vp' exceeds the bound for a well-defined "0" or "1", the input noise exceeds the instance noise tolerance. Further aspects of the treatment of noise and its tolerance in circuit simulations is described in the concurrently filed U.S. application entitled "Shape Based Noise Tolerance Characterization and Analysis of LSI" by Jianlin Wei, Lifeng Wu and I-Hsien Chen which claims priority from U.S. provisional patent application Ser. No. 60/387, 294, filed Jun. 7, 2002, both of which are incorporated by reference.

It is well known in the art that logic or digital systems and/or methods can include a wide variety of different components and different functions in a modular fashion. The following will be apparent to those of skill in the art from the teachings provided herein. Different embodiments of the present invention can include different combinations of elements and/or functions. Different embodiments of the present invention can include actions or steps performed in a different order than described in any specific example herein. Different embodiments of the present invention can include groupings of parts or components into larger parts or components different than described in any specific example herein. For purposes of clarity, the invention is described in terms of systems that include many different innovative components and innovative combinations of innovative components and known components. No inference should be taken to limit the invention to combinations containing all of the innovative components listed in any illustrative embodiment in this specification. The functional aspects of the invention, as will be understood from the teachings herein, may be implemented or accomplished using any appropriate implementation environment or programming language, such as C++, Java, JavaScript, etc.

The present invention is presented largely in terms of procedures, steps, logic blocks, processing, and other symbolic representations that resemble data processing devices. These process descriptions and representations are the means used by those experienced or skilled in the art to most effectively convey the substance of their work to others skilled in the art. The method along with the system to be described in detail below is a self-consistent sequence of processes or steps leading to a desired result. These steps or processes are those requiring physical manipulations of physical quantities. Usually, though not necessarily, these quantities may take the form of electrical signals capable of being stored, transferred, combined, compared, displayed and otherwise manipulated in a computer system or electronic computing devices. It proves convenient at times, principally for reasons of common usage, to refer to these signals as bits, values, elements, symbols, operations, messages, terms, numbers, or the like. It should be borne in mind that all of these similar terms are to be associated with the appropriate physical quantities and are merely convenient labels applied to these quantities. Unless specifically stated otherwise as apparent from the following description, it is appreciated that throughout the present invention, discussions utilizing terms such as processing or computing or verifying or displaying or the like, refer to the actions and processes of a computing device that manipulates and transforms data represented as physical quantities within the device's registers and memories into analog output signals via resident transducers.

Many aspects of the methods of the present invention will most commonly be implemented in software as a computer program product, although many of these can be implemented in hardware or by a combination of software and hardware. As will be understood in the art, the invention or components thereof may be embodied in a fixed media program component containing logic instructions and/or data that when loaded into an appropriately configured computing device cause that device to perform according to the invention. As will be understood in the art, a fixed media program may be delivered to a user on a fixed media for loading in a users computer or a fixed media program can reside on a remote server that a user accesses through a communication medium in order to download a program component. Examples of such fixed media include a disktype optical or magnetic media, magnetic tape, solid state memory, etc. The invention may be embodied in whole or in part as software recorded on this fixed media.

The invention also may be embodied in whole or in part within the circuitry of an application specific integrated circuit (ASIC) or a programmable logic device (PLD). In such a case, the invention may be embodied in a computer understandable descriptor language which may be used to create an ASIC or PLD that operates as herein described.

Although the invention has been described with respect to various exemplary embodiments, it will be understood that the invention is entitled to protection within the full scope of the appended claims.

It is claimed:

1. A method of determining noise propagation in an integrated circuit, comprising:
   receiving a characterization of a noise waveform incident on a cell of the integrated circuit, wherein said characterization comprises information on a shape of the incident noise waveform,
   wherein said shape of the incident noise waveform is characterized by an incident parameter set including an amplitude parameter and a plurality of shape parameters,
   reducing dimensionality of said incident parameter set;
   simulating response of said cell to the characterized noise waveform, wherein said simulating the response of said cell is performed using the reduced incident parameter set;
   determining a characterization of resultant noise output of said cell based upon said results of simulating;
   determining an output parameter set; and
   determining a correction parameter set that accounts for errors between the outputs obtained with reduced incident parameter set and the outputs obtained with incident parameter set.

2. The method of claim 1, further comprising:
   receiving a characterization of a load capacitance of said cell, wherein said simulating simulates the response of said cell having said load capacitance to the characterized noise waveform.

3. The method of claim 1, wherein said one or more shape parameters includes a width parameter for said incident noise waveform.

4. The method of claim 1, wherein said incident noise waveform is approximated by a triangular waveform.

5. The method of claim 4, wherein said one or more shape parameters includes a leading edge slope and a trailing edge slope of the triangle waveform.

6. The method of claim 4, wherein characterization of the resultant noise output is approximated by a triangular waveform.

7. The method of claim 6, wherein said characterization of the resultant noise output includes a leading edge slope and a trailing edge slope of the resultant noise output and an amplitude of the resultant noise output.

8. The method of claim 1, wherein said simulating the response of said cell is performed using a SPICE type simulation.

9. The method of claim 1, further comprising:
storing said characterization of the resultant noise output in a library.

10. The method of claim 1, further comprising
storing said output parameter set and said correction parameter set in a library.

11. The method of claim 1, wherein said determining a characterization of the resultant noise output comprises:
performing an extrapolation from said output parameter using said correction parameter set and the incident parameter set.

12. The method of claim 1 , further comprising:
determining said characterization of incident noise waveform from data on the incident noise waveform.

13. A computer readable storage device embodying a program of instructions executable by a computer to perform a method of determining noise propagation in an integrated circuit, said program comprising instructions for:
receiving a characterization of a noise waveform incident on a cell of the integrated circuit, wherein said characterization comprises information on a shape of the incident noise waveform,
wherein said shape of the incident noise waveform is characterized by an incident parameter set including an amplitude parameter and a plurality of shape parameters,
reducing dimensionality of said incident parameter set;
simulating response of said cell to the characterized noise waveform, wherein said simulating the response of said cell is performed using the reduced incident parameter set;
determining a characterization of resultant noise output of said cell based upon said results of simulating;
determining an output parameter set; and
determining a correction parameter set that accounts for errors between the outputs obtained with reduced incident parameter set and the outputs obtained with incident parameter set.

14. A computer readable storage device embodying a program of instructions executable by a computer to perform a method of simulating the operation of an integrated circuit, said program comprising instructions for:
receiving a set of input parameters specifying a characterization of a noise waveform incident on a cell of said integrated circuit, wherein said characterization comprises information on a shape of the incident noise waveform,
wherein said characterization comprises an incident parameter set including an amplitude parameter and a plurality of shape parameters,
reducing the dimensionality of said incident parameter set,
simulating response of said cell using the reduced incident parameter set;
characterizing resultant noise output by determining a set of output parameters characterizing response of said cell to the incident noise waveform, wherein said determining comprises using a library of look-up tables;
determining a set of correction parameters that accounts for errors between the outputs obtained with reduced incident parameter set and the outputs obtained with incident parameter set; and
performing an extrapolation from said output parameter set using said correction parameter set and the input parameter set.

15. A method of simulating the operation of an integrated circuit, comprising:
receiving a set of input parameters specifying a characterization of a noise waveform incident on a cell of said integrated circuit, wherein said characterization comprises information on a shape of the incident noise waveform,
wherein said characterization comprises an incident parameter set including an amplitude parameter and a plurality of shape parameters,
reducing the dimensionality of said incident parameter set,
simulating response of said cell using the reduced incident parameter set;
characterizing resultant noise output by determining a set of output parameters characterizing response of said cell to the incident noise waveform, wherein said determining comprises using a library of look-up tables;
determining a set of correction parameters that accounts for errors between the outputs obtained with reduced incident parameter set and the outputs obtained with incident parameter set; and
performing an extrapolation from said output parameter set using said correction parameter set and the input parameter set.

16. The method of claim 15, wherein said determining comprises using said set of input parameters in a set of formulae to determine the set of output parameters.

17. The method of claim 15, wherein said one or more shape parameters includes a width parameter for said incident noise waveform.

18. The method of claim 15, wherein said incident noise waveform is approximated by a triangular waveform.

19. The method of claim 18, wherein said one or more shape parameters includes a leading edge slope and a trailing edge slope of the triangle waveform.

20. The method of claim 18, wherein characterization of the resultant noise output is approximated by a triangular waveform.

21. The method of claim 20, wherein said characterization of the resultant noise output includes a leading edge slope and a trailing edge slope of the resultant noise output and an amplitude of the resultant noise output.

22. The method of claim 15, further comprising:
determining said set of input parameters of incident noise waveform from data on the incident noise waveform.

* * * * *